(12) United States Patent
Pritiskutch et al.

(10) Patent No.: US 9,673,103 B2
(45) Date of Patent: Jun. 6, 2017

(54) MOSFET DEVICES WITH ASYMMETRIC STRUCTURAL CONFIGURATIONS INTRODUCING DIFFERENT ELECTRICAL CHARACTERISTICS

(71) Applicant: STMicroelectronics, Inc., Coppell, TX (US)

(72) Inventors: John C. Pritiskutch, Orwigsburg, PA (US); Richard Hildenbrandt, Bath, PA (US)

(73) Assignee: STMICROELECTRONICS, INC., Coppell, TX (US)

( * ) Notice: Subject to any disclaimer, the term of this patent is extended or adjusted under 35 U.S.C. 154(b) by 8 days.

(21) Appl. No.: 14/754,812

(22) Filed: Jun. 30, 2015

(65) Prior Publication Data

US 2017/0005009 A1    Jan. 5, 2017

(51) Int. Cl.
*H01L 29/78*      (2006.01)
*H01L 21/8234*   (2006.01)
*H01L 27/088*    (2006.01)

(52) U.S. Cl.
CPC ......... *H01L 21/823487* (2013.01); *H01L 21/823412* (2013.01); *H01L 27/088* (2013.01)

(58) Field of Classification Search
CPC .................................................. H01L 29/7802
USPC ......................................... 257/341, 342, 392
See application file for complete search history.

(56) References Cited

U.S. PATENT DOCUMENTS

| | | | |
|---|---|---|---|
| 4,884,113 A * | 11/1989 | Muramoto | H01L 29/7802 257/342 |
| 6,040,609 A | 3/2000 | Frisina et al. | |
| 6,222,232 B1 | 4/2001 | Magri' et al. | |
| 6,326,271 B2 | 12/2001 | Magri' et al. | |
| 6,466,489 B1 | 10/2002 | Ieong et al. | |
| 6,503,786 B2 | 1/2003 | Klodzinski | |
| 6,750,512 B2 | 6/2004 | Schillaci et al. | |
| 6,919,252 B2 | 7/2005 | Schillaci et al. | |
| 7,253,459 B2 * | 8/2007 | Huang | H01L 29/0634 257/288 |

OTHER PUBLICATIONS

Sattar, Abdus et al: "MOSFETs Withstand Stress of Linear-Mode Operation," Power Electronics Technology, Apr. 2007, pp. 34-39.
Sattar, Abdus: "Power MOSFET Basics," IXYS Corporation, IXAN0061, pp. 1-11, Jun. 2015.

* cited by examiner

*Primary Examiner* — Mark Prenty
(74) *Attorney, Agent, or Firm* — Gardere Wynne Sewell LLP (57) ABSTRACT

First and second transistors with different electrical characteristics are supported by a substrate having a first-type dopant. The first transistor includes a well region within the substrate having the first-type dopant, a first body region within the well region having a second-type dopant and a first source region within the first body region and laterally offset from the well region by a first channel. The second transistor includes a second body region within the semiconductor substrate layer having the second-type dopant and a second source region within the second body region and laterally offset from material of the substrate by a second channel having a length greater than the length of the first channel. A gate region extends over portions of the first and second body regions for the first and second channels, respectively.

21 Claims, 6 Drawing Sheets

MOSFET DEVICES WITH ASYMMETRIC STRUCTURAL CONFIGURATIONS INTRODUCING DIFFERENT ELECTRICAL CHARACTERISTICS

TECHNICAL FIELD

The present invention relates to metal oxide semiconductor (MOS) type field effect transistor (FET) devices and, in particular, to the provision of MOSFETs having different electrical characteristics due to asymmetric structural configurations.

BACKGROUND

Those skilled in the art recognize the need for providing MOSFET devices on a single integrated circuit substrate where those MOSFET devices exhibit different electrical characteristics (such as, for example, zero temperature coefficient, on resistance (Rds on), threshold voltage (Vth), transconductance (gfs), etc.). This need may, for example, arise in the context of providing vertical MOSFET transistors. Know solutions in the art may utilize dopant concentrations for implants, different thicknesses of the gate oxides, different shapes for the body regions, different dimensions of the source regions, etc., to have an effect on setting different electrical characteristics. Prior art solutions for forming different electrical characteristic MOSFET devices, however, are understood to require expensive and complex fabrication processes. There is a need in the art for a fabrication process which is less expensive and less complex.

SUMMARY

In an embodiment, an integrated circuit comprises: a semiconductor substrate layer having a first conductivity-type dopant at a first dopant concentration level, the substrate layer including a first region and a second region; a well region in the semiconductor substrate layer having the first conductivity-type dopant at a second dopant concentration level greater than the first dopant concentration level, said well region located in the first region but not the second region; a first body region in the well region at the first region having a second conductivity-type dopant; a second body region in the semiconductor substrate layer at the second region; a first source region in the first body region laterally offset from the well region by a first channel having a first length; a second source region in the second body region laterally offset from material of the semiconductor substrate layer by a second channel having a second length greater than the first length; and a gate region extending over both the first and second channels.

In an embodiment, a method for fabricating transistors in a semiconductor substrate layer having a first conductivity-type dopant at a first dopant concentration level, the substrate layer including a first region and a second region, comprises: forming a gate region extending over the first and second regions; implanting first conductivity-type dopant in the first region, but not the second region, of the semiconductor substrate layer to form a well implant; implanting second conductivity-type dopant in the well implant in the first region and in the semiconductor substrate layer in the second region to form a first body implant in the first region and a second body implant in the second region; annealing to activate and diffuse the first and second conductivity-type dopants to form a well region in the semiconductor substrate layer from the well implant having a second dopant concentration level greater than the first dopant concentration level, a first body region in the well region from the first body implant and a second body region in the semiconductor substrate layer from the second body implant; implanting first conductivity-type dopant in the well region to form a first source implant and in the second body region for form a second source implant; and annealing to activate and diffuse the first conductivity-type dopants of the first and second source implants to form first and second source regions.

In an embodiment, an integrated circuit comprises: a semiconductor substrate layer having a first conductivity-type dopant at a first dopant concentration level, the substrate layer including a first region and a second region; a first transistor within the first region having an electrical characteristic with a first value, and a second transistor within the second region having said electrical characteristic with a second value different from the first value. The first transistor comprises: a well region in contact with the semiconductor substrate layer having the first conductivity-type dopant at a second dopant concentration level greater than the first dopant concentration level; a first body region within and in contact with the well region having a second conductivity-type dopant; a first source region within and an contact with the first body region, the first source region laterally offset from the well region by a first channel having a first length; and a first gate region extending over the first channel. The second transistor comprises: a second body region within and in contact with the semiconductor substrate layer having the second conductivity-type dopant; a second source region within and in contact with the second body region, the second source region laterally offset from material of the semiconductor substrate layer by a second channel having a second length greater than the first length; and a second gate region extending over the second channel.

In an embodiment, a method for fabricating an integrated circuit on a semiconductor substrate layer having a first conductivity-type dopant at a first dopant concentration level, the substrate layer including a first region and a second region, comprising: forming a well region within and in contact with the first region of the semiconductor substrate layer, said well region having the first conductivity-type dopant at a second dopant concentration level greater than the first dopant concentration level; forming a first body region within and in contact with the well region having a second conductivity-type dopant; forming a second body region within and in contact with the semiconductor substrate layer at the second region also having the second conductivity-type dopant; forming a first source region within and in contact with the first body region at a position that is laterally offset from the well region by a first channel region having a first length; forming a second source region within and in contact with the second body region at a position that is laterally offset from material of the semiconductor substrate layer by a second channel region having a second length greater than the first length; and forming a gate region extending over both the first and second channel regions.

BRIEF DESCRIPTION OF THE DRAWINGS

For a better understanding of the embodiments, reference will now be made by way of example only to the accompanying figures in which.

It will be understood that the illustrations described herein are not necessarily presented to scale.

DETAILED DESCRIPTION

Figure 1:
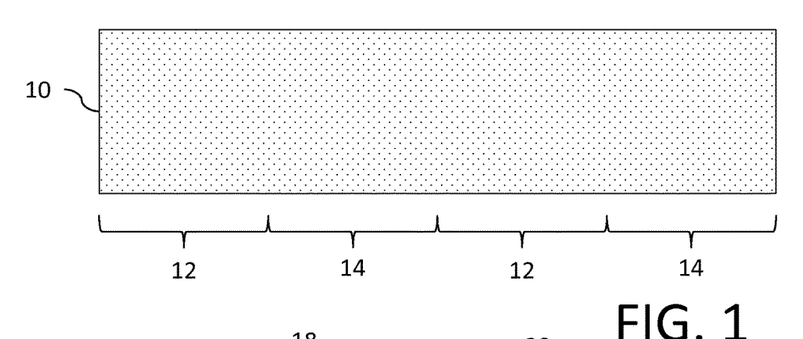
FIGS. 1-12 illustrate process steps for the fabrication of vertical MOSFET devices having different values of an electrical characteristic.

FIG. 1 illustrates a semiconductor substrate layer 10. The layer 10 may, for example, comprise silicon and may, for example, be lightly-doped with a first conductivity-type dopant such as an n-type dopant with a dopant concentration of $5 \times 10^{14}$ atoms/cm$^3$. The substrate layer 10 may, for example, comprise a bulk semiconductor substrate. Alternatively, the substrate layer 10 may comprise a layer of a multi-layer substrate configuration. The substrate layer 10 may comprise an epitaxial layer. The layer 10 may have a thickness of 15 microns.

The substrate layer 10 includes a first region 12 provided for the formation of a first vertical MOSFET device (FIG. 11, reference 12T) having a first set of electrical characteristics and a second region 14 provided for the formation of a second vertical MOSFET device (FIG. 11, reference 14T) having a second set of electrical characteristics. The regions 12 and 14 are adjacent to each other. Still further, the adjacent regions 12 and 14 may be alternately replicated across the substrate layer in an interdigitated fashion to support the fabrication of plural interdigitated vertical MOSFETs having different threshold voltages. In this context, the electrical characteristics at issue comprise one or more of zero temperature coefficient, on resistance (Rds on), threshold voltage (Vth), transconductance (gfs), such that the first and second transistors as fabricated exhibit different values with respect to at least one of said electrical characteristics.

Figure 2:
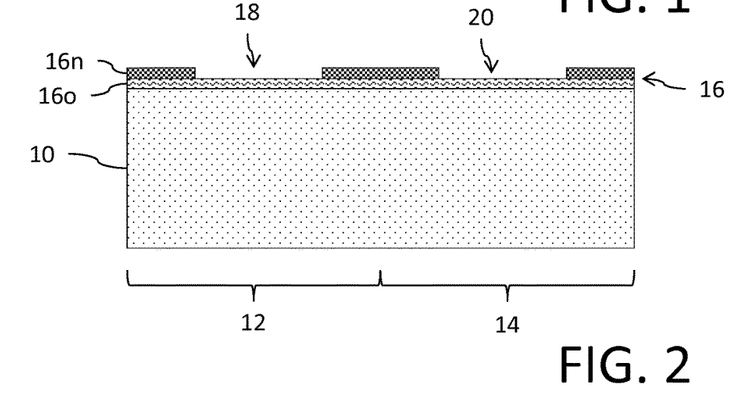

FIG. 2 focuses on just two adjacent regions 12 and 14 of the substrate layer 10. A mask 16 comprised, for example, of an oxide layer (for example, silicon oxide) 16$o$ and a nitride layer (for example, silicon nitride) 16$n$ is deposited on the top surface of the layer 10. Using well known lithographic patterning techniques, the mask 16 is patterned to define openings 18 and 20 for the regions 12 and 14, respectively, which extend through the nitride layer 16$n$ and stop at or in the oxide layer 16$o$. The openings 18 and 20 may, for example, comprise stripe openings extending into and out of the page of the illustration. Alternatively, the openings 18 and 20 may comprise geometric cells such as hexagons arranged in an array pattern. Such patterns for vertical MOSFET devices are known to those skilled in the art.

Figure 3:
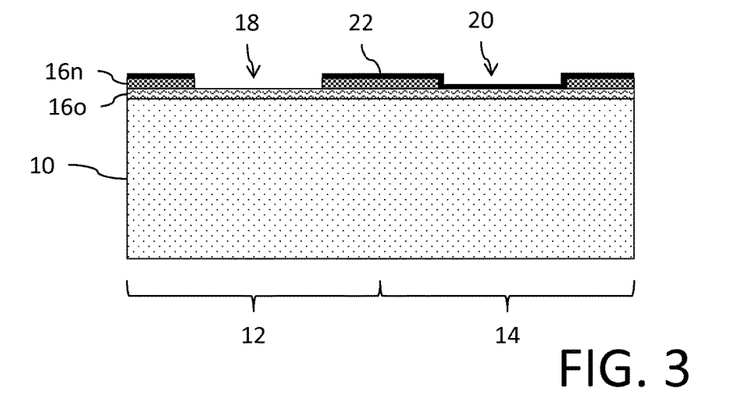

A blocking layer 22 is deposited on the mask 16 and patterned so that the opening 20 is covered but the opening 18 is exposed. This is shown in FIG. 3.

Figure 4:
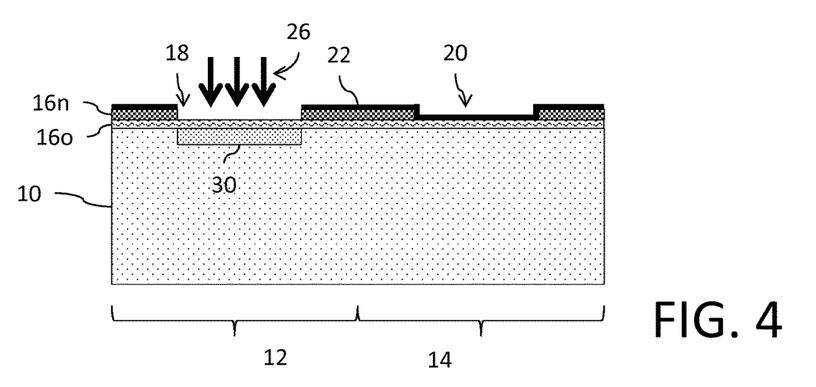

Using the patterned blocking layer 22 as a mask, an implantation 26 of a first conductivity-type dopant such as an n-type dopant with a dopant concentration of $5 \times 10^{13}$ atoms/cm$^2$ at 50 KeV is then made through the opening 18 to form a heavily-doped region 30 in the substrate 10 within region 12. The result is shown in FIG. 4. The patterned blocking layer 22 is then removed. The heavily-doped region 30 has a shape (stripe, hexagonal, etc.) conforming to the shape of the opening 18.

Figure 5:
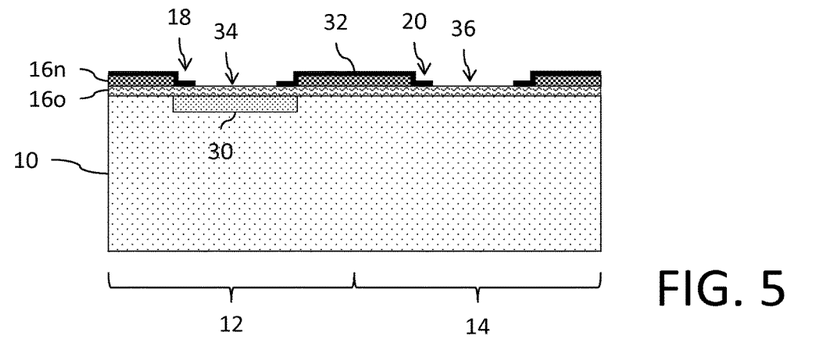

A layer of polysilicon material is then conformally deposited over the mask 16 using a vapor deposition process. The polysilicon material may have a thickness of 600 nm and is doped as needed for the application. Using well known lithographic patterning techniques, the layer of polysilicon material is patterned to define gate regions 32 which conformally straddle over the patterned nitride layer portions of the mask 16 and partially extend over the oxide layer 16$o$ at each edge of the openings 18 and 20, with the patterning defining an opening 34 in the polysilicon layer within the opening 18 and an opening 36 in the polysilicon layer within the opening 20. This is shown in FIG. 5. The openings 34 and 36 are smaller than the openings 18 and 20, respectively, but have generally the same shape (stripe, hexagon, etc.). The portion of the oxide layer 16$o$ over which the gate regions 32 extends defines the gate oxide for the transistor devices.

Figure 6:
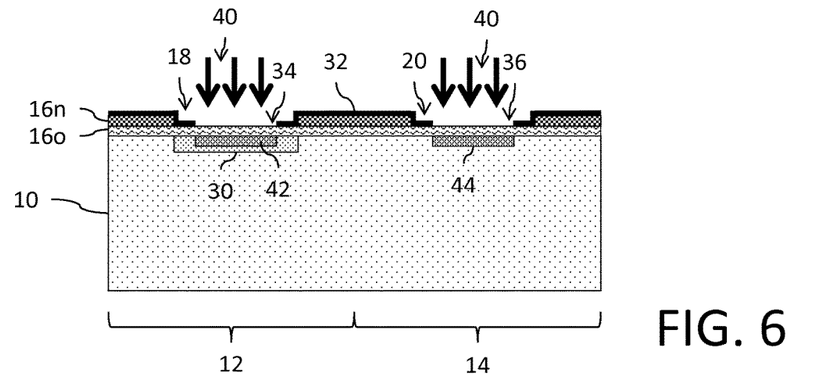

Using the patterned polysilicon layer with gate regions 32 as a mask, an implantation 40 of a second conductivity-type dopant such as a p-type dopant with a dopant concentration of $4 \times 10^{13}$ atoms/cm$^2$ at 50 KeV is then made through the openings 34 and 36 to form heavily-doped regions 42 and 44 in the substrate 10 within regions 12 and 14, respectively. The result is shown in FIG. 6. The heavily-doped regions 42 and 44 have shapes (stripe, hexagonal, etc.) conforming to the shapes of the openings 34 and 36.

Figure 7:
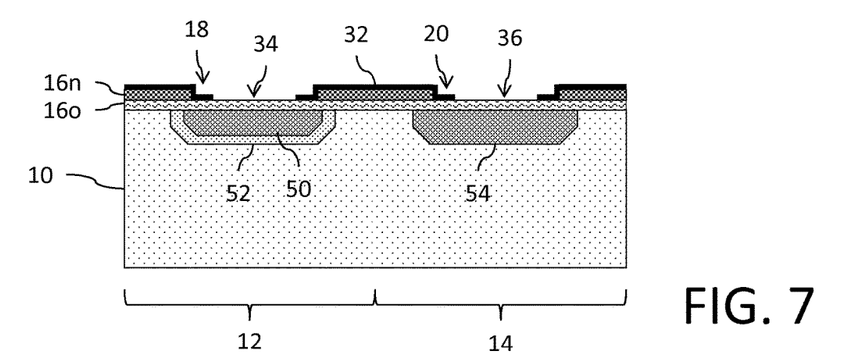

A thermal anneal is then performed to activate and diffuse the implanted dopants in regions 30, 42 and 44. The result is shown in FIG. 7. The anneal may, for example, comprise an anneal at 1160° C. for 30 minutes. The region 12 includes a p-type body region 50 with a dopant concentration of $2.5 \times 10^{20}$ atoms/cm$^3$ surrounded by (i.e., located within and in contact with) an n-type well 52 with a dopant concentration of $8 \times 10^{14}$ atoms/cm$^3$ formed within and in contact with the n-type substrate 10 with a dopant concentration of $5 \times 10^{14}$ atoms/cm$^3$. The body region 50 and well 52 have shapes (stripe, hexagon, etc.) which conform generally to the shapes of the openings 34 and 18, respectively. The region 14 includes a p-type body region 54 with a dopant concentration of $2.5 \times 10^{20}$ atoms/cm$^3$ formed within and in contact with the n-type substrate 10 with a dopant concentration of $5 \times 10^{14}$ atoms/cm$^3$. The body region 54 has a shape (stripe, hexagon, etc.) which conforms generally to the shape of the opening 36. In this regard, the dopant of region 30 constrains to extent of the diffusion of the dopant of region 42 within region 12, but no such constraint is present within region 14 with respect to the diffusion of dopant of region 44. The extent of diffused region 52 and the extent of diffused region 54 are generally the same (i.e., these regions occupy a relatively same lateral area and extend to a relatively same depth). The extent of diffused region 50 is wholly contained within diffused region 52.

Figure 8:
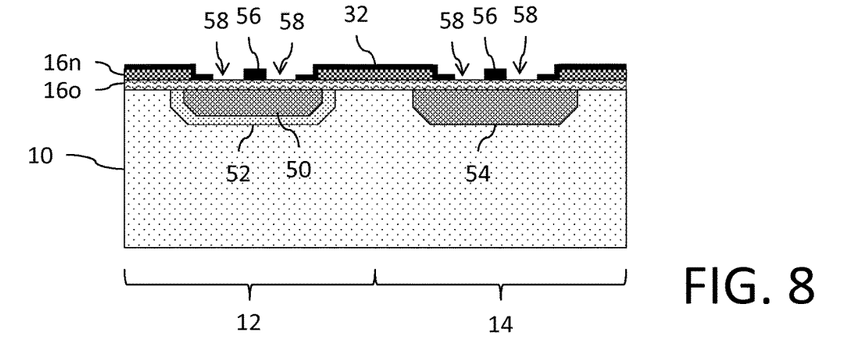

A layer of masking material is deposited and patterned within each opening 34 and 36 to define a blocking mask 56 having source openings 58. This is shown in FIG. 8. The mask 52 is, for example, positioned in the middle of the openings 34 and 36 to define the openings 58 between the blocking mask 56 and the gate region 32. In the implementation where the openings 18, 20, 34 and 26 are in the form of stripes extending into and out of the page of the illustration, the mask 56 likewise has the shape of a stripe extending into and out of the page of the illustration and the openings 58 will likewise have a stripe shape (that may be connected to each other at either or both ends). For the implementation where the openings 18, 20, 34 and 26 are in the form of geometric cell, such as a hexagon, the mask 56 is in the form of an island structure with a conforming shape centered in the cell such that the openings 58 may have annular shapes surrounding the mask 56.

Figure 9:
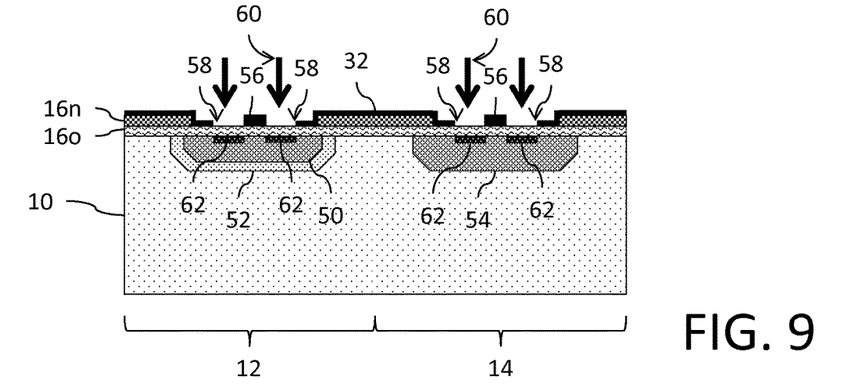

Using the gate regions 32 and the blocking mask 56 as a mask, an implantation 60 of a first conductivity-type dopant such as an n-type dopant with a dopant concentration of $5 \times 10^{15}$ atoms/cm$^2$ at 50 KeV is then made through the openings 58 to form heavily-doped regions 62 in the substrate 10 within p-type body regions 50 and 54. The result is shown in FIG. 9. The heavily-doped regions 62 have shapes (stripe, annular, etc.) conforming to the shapes of the openings 58.

Figure 10:
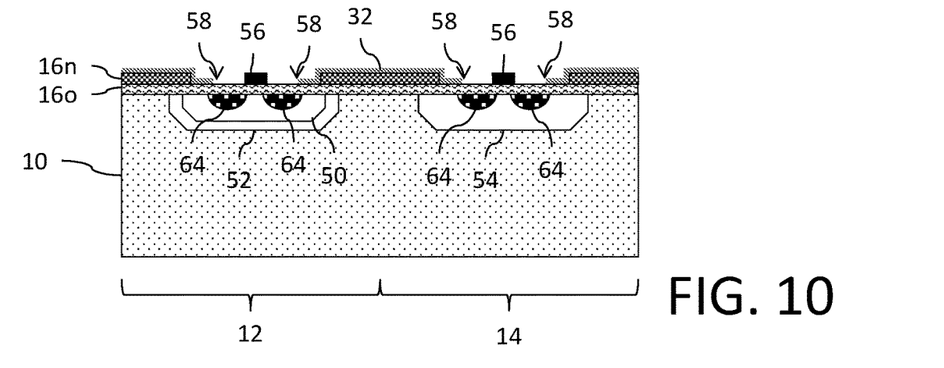

A thermal anneal is then performed to activate and diffuse the implanted dopants in regions 62. The result is shown in FIG. 10. The anneal may, for example, comprise an anneal at a temperature of 850° C. for 30 minutes. Each of the p-type body regions 50 and 54 includes source regions 64 each having a dopant concentration of $3.5 \times 10^{23}$ atoms/cm$^3$. The source regions 64 are accordingly formed within and in contact with their supporting body region. The blocking mask 56 is then removed. The source region 64 has a shape (stripe, annular, etc.) which conforms generally to the shape of the opening 58.

Figure 11:
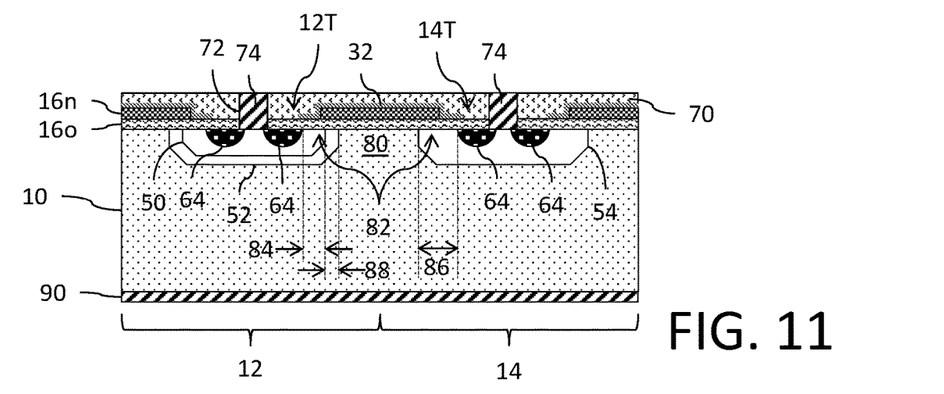
Figure 12:
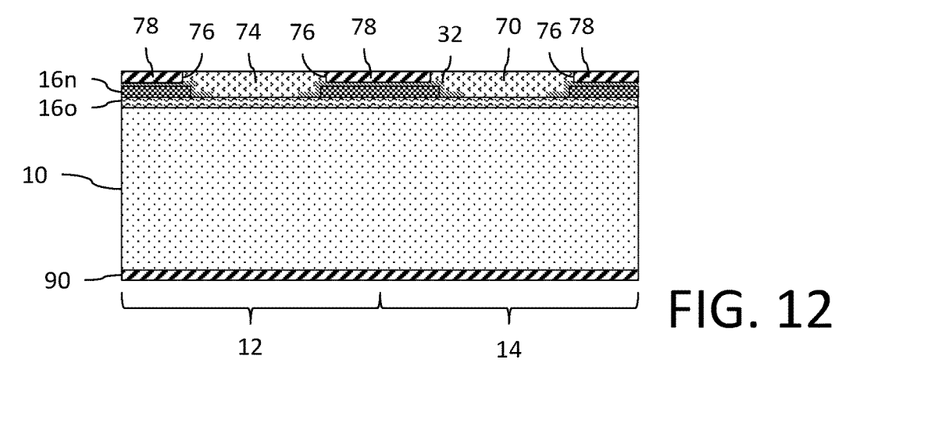

The fabrication of the integrated circuit is then completed using conventional techniques well known to those skilled in the art which include provision of a planarized insulating layer 70 covering the structures. Openings 72 are formed in the insulating layer 70 as well as in the oxide layer 16o to expose an upper surface of the p-type body regions 50 and 54 and at least a portion of the source regions 64. It will be noted that portions of the oxide layer 16o that are not removed provide the gate oxide material under the gate regions 32. Metal material is then deposited in the openings 72 to form source-body contacts 74. The result is shown in FIG. 11. It will be noted that the illustrated source-body contacts 74 are not shown as electrically connected, but this is possible by providing metallization layers or by depositing the metal which fills the openings 72 to laterally extend over the layer 70. Openings 76 are further formed in the insulating layer 70 to expose an upper surface of the gate regions 32. Metal material is then deposited in the openings 76 to form gate contacts 78. The result is shown in FIG. 12 (which is a cross-section in a plane parallel to but offset from the cross-section of FIG. 11). The gate contacts 78 may preferably be formed outside of the active region where the p-type body regions 50 and 54 are formed, for example at the perimeter of the integrated circuit. It will be noted that the illustrated gate contacts 78 are not shown as electrically connected, but this is possible by providing metallization layers or by depositing the metal which fills the openings 76 to laterally extend over the layer 70.

Figure 13:
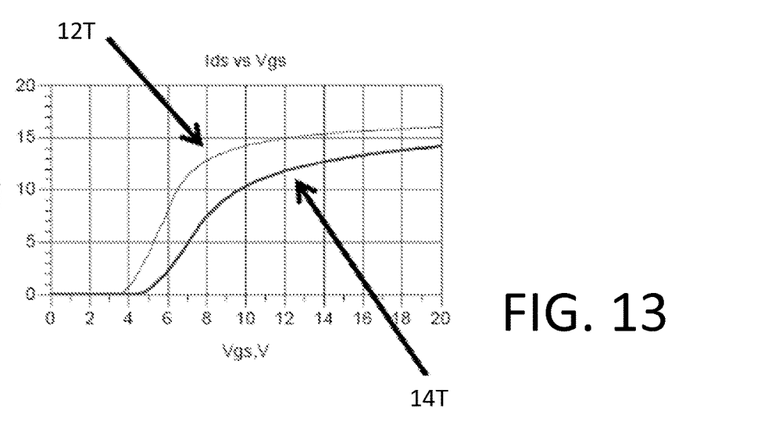
FIGS. 13-14 plot electrical characteristics of asymmetric transistors fabricated using the process of FIGS. 10-12.
Figure 14:
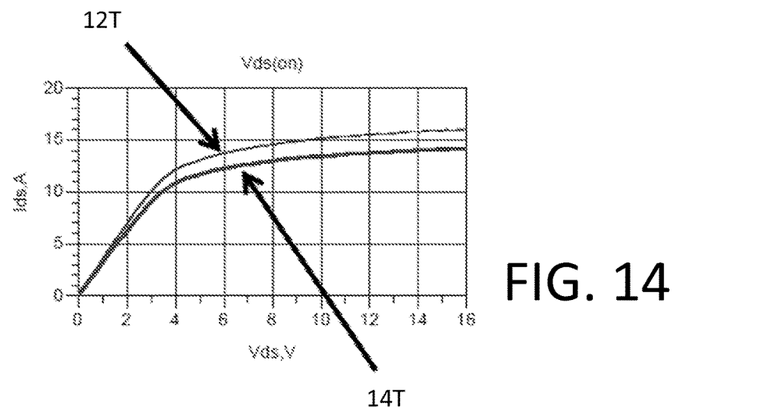

The drain region 80 for the transistor devices is formed by the substrate layer 10 and the well 52. A metal layer 90 deposited on the back side of the substrate layer 10 provides the drain contact. The channel regions 82 for the transistor devices are formed by the portions of the p-type body regions 50 and 54 which laterally extend between the source region 64 and the well 52 and substrate layer 10. The channel lengths are asymmetric. The transistor 12T in region 12 has a channel length 84 while the transistor 14T in region 14 has a longer channel length 86 (where the difference in channel lengths is substantially equal to a lateral thickness 88 of the well 52). As a result, the transistors in regions 12 and 14 will have different electrical characteristics (in particular, for example, different threshold voltages) and asymmetric operation as shown in FIGS. 13 and 14 which illustrate, respectively, plots of the drain current versus gate-to-source voltage and drain-to-source voltage for the two transistors 12T and 14T.

Figure 15:
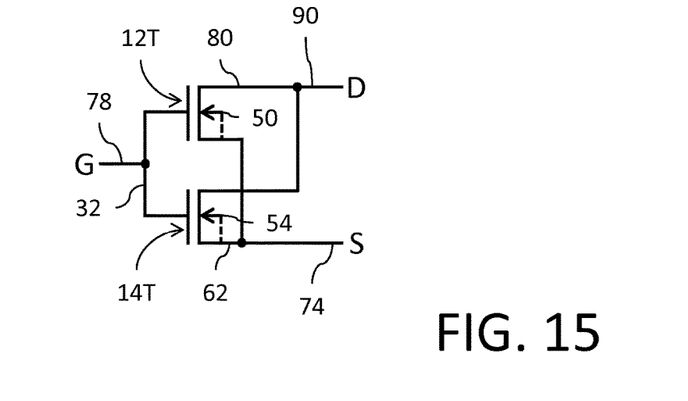
FIG. 15 is a schematic diagram of the integrated circuit with asymmetric transistors.

A schematic diagram of the integrated circuit with transistors 12T and 14T is shown in FIG. 15. In this implementation, the gates of transistors 12T and 14T are connected together (for example, by electrically connecting the gate contacts 78) and the source-body regions are connected together (for example, by electrically connecting the source-body contacts 74).

Figure 16:
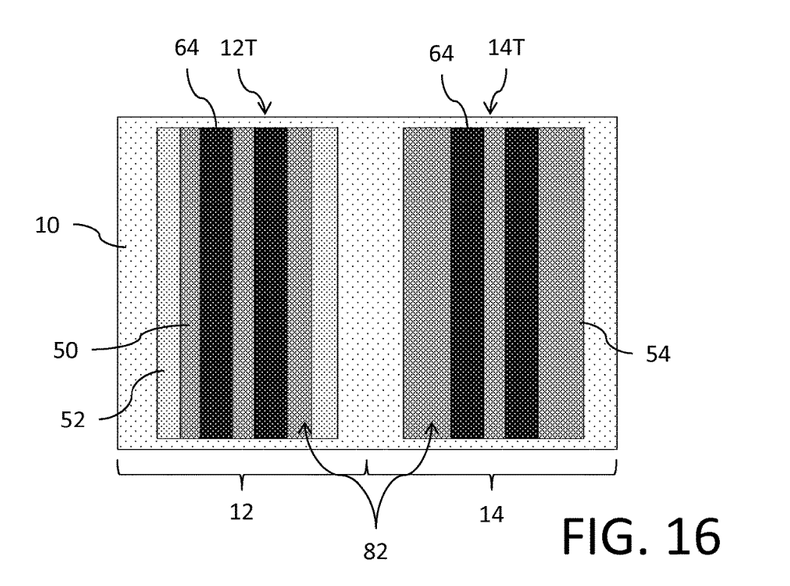
FIG. 16 is a plan view of the doped regions of the substrate with a stripe configuration for the asymmetric transistors.

FIG. 16 illustrates in plan view an example of the stripe shape configurations for the well 52, body regions 50 and 54 and source regions 64 in one embodiment. This is only one representative example, and other configurations such as an array of geometric cells could be provided.

The foregoing description has been provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An integrated circuit, comprising:
    a semiconductor substrate layer having a first conductivity-type dopant at a first dopant concentration level, the semiconductor substrate layer including a first region and a second region;
    a well region in the semiconductor substrate layer having the first conductivity-type dopant at a second dopant concentration level greater than the first dopant concentration level, said well region located in the first region but not the second region;
    a first body region in the well region at the first region having a second conductivity-type dopant;
    a second body region in the semiconductor substrate layer at the second region also having the second conductivity-type dopant;
    a first source region in the first body region laterally offset from the well region by a first channel having a first length;
    a second source region in the second body region laterally offset from material of the semiconductor substrate layer by a second channel having a second length greater than the first length; and
    a gate region extending over both the first and second channels.

2. The integrated circuit of claim 1, wherein the second length exceeds the first length by a lateral thickness of the well region.

3. The integrated circuit of claim 1, further comprising:
    a drain metal in contact with the semiconductor substrate layer;
    a source metal in contact with the first and second source regions and the first and second body regions; and
    a gate metal in contact with the gate region.

4. The integrated circuit of claim 1, wherein the semiconductor substrate layer is an epitaxial layer.

5. The integrated circuit of claim 1, wherein the well region, the first and second body regions, and the source regions each have a stripe shape.

6. The integrated circuit of claim 1, wherein the first body region and first source region are associated with a first transistor, and wherein the second body region and second source region are associated with a second transistor, and wherein the first and second transistors have different electrical characteristics.

7. The integrated circuit of claim 6, wherein an electrical characteristic which is different is selected from the group consisting of zero temperature coefficient, on resistance, threshold voltage and transconductance.

8. An integrated circuit, comprising:
a semiconductor substrate layer having a first conductivity-type dopant at a first dopant concentration level, the semiconductor substrate layer including a first region and a second region;
a first transistor within the first region having an electrical characteristic with a first value, comprising:
 a well region in contact with the semiconductor substrate layer having the first conductivity-type dopant at a second dopant concentration level greater than the first dopant concentration level;
 a first body region within and in contact with the well region having a second conductivity-type dopant;
 a first source region within and in contact with the first body region, the first source region laterally offset from the well region by a first channel having a first length; and
 a first gate region extending over the first channel;
a second transistor within the second region having said electrical characteristic with a second value different from the first value, comprising:
 a second body region within and in contact with the semiconductor substrate layer having the second conductivity-type dopant;
 a second source region within and in contact with the second body region, the second source region laterally offset from material of the semiconductor substrate layer by a second channel having a second length greater than the first length; and
 a second gate region extending over the second channel.

9. The integrated circuit of claim 8, wherein the second length exceeds the first length by a lateral thickness of the well region.

10. The integrated circuit of claim 8, further comprising:
a drain metal in contact with the semiconductor substrate layer;
a source metal in contact with the first and second source regions and the first and second body regions; and
a gate metal in contact with the gate region.

11. The integrated circuit of claim 8, wherein the semiconductor substrate layer is an epitaxial layer.

12. The integrated circuit of claim 8, wherein each of the well region, the first and second body regions and the source regions has a stripe shape.

13. The integrated circuit of claim 8, wherein the electrical characteristic is selected from the group consisting of zero temperature coefficient, on resistance, threshold voltage and transconductance.

14. An integrated circuit, comprising:
a semiconductor substrate layer;
a well region in the semiconductor substrate layer;
a first body region of a first transistor contained within the well region;
a second body region of a second transistor contained within the semiconductor substrate layer, said second body region separated from said well region by a portion of the semiconductor substrate;
a first source region of the first transistor contained within the first body region, wherein said first source region is laterally offset from the well region by a first channel having a first length;
a second source region of the second transistor contained within the second body region, wherein said second source region is laterally offset from said portion of the semiconductor substrate layer by a second channel having a second length greater than the first length; and
a common gate electrode for both the first and second transistors that extends over both the first and second channels.

15. The integrated circuit of claim 14, wherein said semiconductor substrate layer is doped with a first conductivity-type dopant; wherein the well region is doped with the first conductivity-type dopant; and wherein the first and second body regions are doped with a second conductivity-type dopant.

16. The integrated circuit of claim 15, wherein a dopant concentration in the well region exceeds a dopant concentration of the semiconductor substrate layer.

17. The integrated circuit of claim 14, wherein said semiconductor substrate layer forms a common drain of the first and second transistors.

18. The integrated circuit of claim 17, further comprising a common source metal in contact with the first and second source regions.

19. The integrated circuit of claim 14, wherein the second length exceeds the first length by a lateral thickness of the well region.

20. The integrated circuit of claim 14, wherein the semiconductor substrate layer is an epitaxial layer.

21. The integrated circuit of claim 14, wherein the well region, the first and second body regions, and the source regions each have a stripe shape.

* * * * *